United States Patent
Fuhrmann et al.

(10) Patent No.: US 12,484,313 B2
(45) Date of Patent: Nov. 25, 2025

(54) STACKED MONOLITHIC UPRIGHT METAMORPHIC MULTIJUNCTION SOLAR CELL

(71) Applicant: AZUR SPACE Solar Power GmbH, Heilbronn (DE)

(72) Inventors: Daniel Fuhrmann, Heilbronn (DE); Rosalinda Van Leest, Heilbronn (DE); Matthias Meusel, Heilbronn (DE)

(73) Assignee: Azur Space Solar Power GmbH, Heilbronn (DE)

( * ) Notice: Subject to any disclaimer, the term of this patent is extended or adjusted under 35 U.S.C. 154(b) by 0 days.

(21) Appl. No.: 16/715,388

(22) Filed: Dec. 16, 2019

(65) Prior Publication Data
US 2020/0194607 A1  Jun. 18, 2020

(30) Foreign Application Priority Data
Dec. 14, 2018 (DE) ............ 10 2018 009 744.8

(51) Int. Cl.
H10F 77/124 (2025.01)
H10F 10/142 (2025.01)
(Continued)

(52) U.S. Cl.
CPC ......... *H10F 10/161* (2025.01); *H10F 10/142* (2025.01); *H10F 10/144* (2025.01);
(Continued)

(58) Field of Classification Search
CPC ........... H01L 31/0725; H01L 31/03046; H01L 31/0687; H01L 31/0693; H10F 10/00;
(Continued)

(56) References Cited

U.S. PATENT DOCUMENTS 5,407,491 A * 4/1995 Freundlich ........ H01L 31/03042
117/105
5,753,050 A * 5/1998 Charache .............. H01L 31/072
136/255
(Continued)

FOREIGN PATENT DOCUMENTS

CN 107039557 A 8/2017
EP 1134813 A2 9/2001
(Continued)

OTHER PUBLICATIONS

Michalowski et al. ("A-Crater-within-a-Crater Approach for Secondary Ion Mass Spectrometry Evaluation of the Quality of Interfaces of Multilayer Devices"), ACS Appl. Mater. Interfaces 2018, 10, 37694-37698.*
(Continued)

*Primary Examiner* — Christina Chern
(74) *Attorney, Agent, or Firm* — Muncy, Geissler, Olds & Lowe, P.C.

(57) ABSTRACT

A stacked monolithic upright metamorphic multijunction solar cell, comprising at least one first subcell having a first band gap, a first lattice constant and being made up of germanium by more than 50%, a second subcell, which is disposed above the first subcell and has a second band gap and a second lattice constant, a metamorphic buffer disposed between the first subcell and the second subcell, including a sequence of at least three layers having lattice constants which increase from layer to layer in the direction of the second subcell, and a first tunnel diode, which is situated between the metamorphic buffer and the second subcell and which has an $n^+$ layer and a $p^+$ layer, the second band gap being larger than the first band gap, the $n^+$ layer of the first tunnel diode comprising InAlP, the $p^+$ layer of the first tunnel diode comprising an As-containing III-V material.

19 Claims, 2 Drawing Sheets

(51) Int. Cl.
   *H10F 10/144* (2025.01)
   *H10F 10/161* (2025.01)
   *H10F 10/163* (2025.01)
   *H10F 71/00* (2025.01)

(52) U.S. Cl.
   CPC ....... *H10F 10/163* (2025.01); *H10F 71/1272* (2025.01); *H10F 77/1248* (2025.01)

(58) Field of Classification Search
   CPC .. H10F 10/142; H10F 10/1425; H10F 10/144; H10F 77/1248
   See application file for complete search history.

(56) References Cited

U.S. PATENT DOCUMENTS

| | | | |
|---|---|---|---|
| 6,316,715 B1 | 11/2001 | King et al. | |
| 6,340,788 B1* | 1/2002 | King | H10F 10/142 136/255 |
| 2006/0144435 A1* | 7/2006 | Wanlass | H01L 31/043 257/E27.125 |
| 2010/0212729 A1* | 8/2010 | Hsu | H01L 21/02546 136/255 |
| 2010/0319764 A1 | 12/2010 | Wiemer et al. | |
| 2017/0077340 A1 | 3/2017 | Sato | |
| 2017/0186904 A1 | 6/2017 | Guter et al. | |
| 2017/0222066 A1 | 8/2017 | Derkacs | |
| 2018/0240922 A1 | 8/2018 | Derkacs et al. | |
| 2018/0315879 A1 | 11/2018 | Jain et al. | |

FOREIGN PATENT DOCUMENTS

| | | |
|---|---|---|
| EP | 2251912 A1 | 11/2010 |
| JP | 2011077293 A | 4/2011 |
| WO | WO2011042682 A2 | 4/2011 |

OTHER PUBLICATIONS

Sinharoy et al. ("Progress in the Development of Metamorphic Multi-junction III-V Space Solar Cells"), Prog. PHotovolt: Res. Appl. 2002; 10: 427-432.*

Li et al. ("Be redistribution in GaInP and growth of GaInP/AlInP tunnel diode by gas source molecular beam epitaxy"), Journal of Crystal Growth 209 (2000) 459-462.*

Barrigón et al: "Highly conductive p++-AlGaAs/n++-GaInP tunnel juncitons for ultra-high conenctrator solar cells", pp. 399-404; Progress in Photovoltaics: Research and applications 2014; DOI: 10.1002/pip.2476.

Campesato et al: "High Efficiency Solar Cells based on AlInGaP", pp. 001112-001117; 978-1-4244-2950-9/09.

Kang et al, "Numerical analysis of p-GaAs/n-GaAs tunnel junction employing InAs intermediate layer for high concentrated photovoltaic applications", Journal of Physics: Conference Series 490 (2014).

* cited by examiner

STACKED MONOLITHIC UPRIGHT METAMORPHIC MULTIJUNCTION SOLAR CELL

This nonprovisional application claims priority under 35 U.S.C. § 119(a) to German Patent Application No. 10 2018 009 744.8, which was filed in Germany on Dec. 14, 2018, and which is herein incorporated by reference.

BACKGROUND OF THE INVENTION

Field of the Invention

The present invention relates to a stacked monolithic upright metamorphic multijunction solar cell.

Description of the Background Art

A monolithic upright metamorphic solar cell stack is known from W. Guter et al, "Investigation and development of III-V triple-junction concentrator solar cells," in 22nd European Photovoltaic Solar Energy Conference, September 3-7, 2007, Milan, Italy, pp. 122-125.

A stacked monolithic multijunction solar cell having an improved current conduction between the solar cells is known from EP 2 251 912 A1. For this purpose, a tunnel diode having degenerate layers, strained with respect to each other, is disposed between two consecutive solar cells.

A tensilely strained, degenerate layer is compensated by a compressively strained degenerate layer. The degenerate layers are designed as either carbon-doped degenerate $p^+$ layers or as tellurium- or silicon-doped degenerate $n^+$ layers. Due to the fact that the strain is compensated, no strain acts upon the layers surrounding the tunnel diode; in other words, the sum of the strain is zero.

A multijunction solar cell comprising a nitride-containing subcell is known from US 2010/0319764 A1, an increase of the tunnel current of the multijunction solar cell being achieved by means of a heat treatment. Negative influences of the heat treatment on the tunnel diodes are prevented in that the tunnel diodes include a layer sequence made up of multiple n-doped and p-doped layers and an ErAs intermediate layer.

Study results relating to a two-junction solar cell comprising a GaAS tunnel diode having a thin InAs intermediate layer is presented in "Numerical analysis of p-GaAs/n-GaAs tunnel junction employing InAs intermediate layer for high-concentrated photovoltaic applications," Seokjin Kang et al, Journal of Physics: Conference Series, 490, 2014, 012178, ISSN 1742-6596.

Various multijunction solar cells are known from US 2017/0222066 A1 as well as from EP 1 134 813 A2.

SUMMARY OF THE INVENTION

It is therefore an object of the present invention to provide a device which refines the prior art.

According to an exemplary embodiment of the invention, a stacked monolithic upright metamorphic multijunction solar cell is provided, which comprises at least one first subcell, a second subcell, a metamorphic buffer and at least one first tunnel diode.

The first subcell has a first band gap and a first lattice constant and is made up of germanium by more than 50%.

The second subcell is disposed above the first subcell and has a second band gap and a second lattice constant, the second band gap being larger than the first band gap, and the second lattice constant being larger than the first lattice constant.

The metamorphic buffer is disposed between the first subcell and the second subcell.

The first tunnel diode is disposed between the metamorphic buffer and the second subcell and includes an $n^+$ layer and a $p^+$ layer. The $n^+$ layer of the first tunnel diode comprises InAlP; the $p^+$ layer of the first tunnel diode comprises an As-containing III-V material. An intermediate layer is disposed between the $n^+$ layer and the $p^+$ layer, the intermediate layer being thinner than the $n^+$ layer and the $p^+$ layer in each case.

The term subcell can be used synonymously with the term solar subcell. In other words, the solar cell stack is made up of multiple solar subcells, which are connected in series to each other with the aid of tunnel diodes.

In addition to the indicated materials, the different layers may comprise, for example InAlP or As-containing III-V material and additionally also other elements.

The intermediate layer can have a one-part design and is epitactically manufactured by means of MOVPE (Metalorganic Vapor Phase Epitaxy). Also, one tunnel diode can be formed between two subcells in each case.

The metamorphic buffer can comprise a sequence of at least three layers, each layer having a lattice constant, and the lattice constants of the layers increasing from layer to layer in the direction of the second subcell.

Alternatively, the metamorphic buffer has an almost linear change in the lattice constants and/or the doping between a lower layer and an upper layer.

If layers are made up of a given material composition, it is understood that, in particular, dopants, such as zinc or carbon or silicon, are also included in addition to the specified material composition, without the dopants being explicitly mentioned.

An advantage of the intermediate layer according to the invention is that an undesirable incorporation of an n-type dopant into the $p^+$ layer of the tunnel diode may be reduced with the aid of the intermediate layer. In other words, a cross-contamination may be reduced.

It has been surprisingly shown that the undesirable incorporation of the n-type dopant may be better suppressed with the aid of As-containing layers than with phosphide-containing layers. Those skilled in the art have so far erroneously assumed that As-containing layers, in particular GaAs, are unsuitable due to the absorption losses. The efficiency of the multijunction cell is reduced by the absorption losses, in that the underlying subcells receive less light.

However, the disruptive absorption may be suppressed by designing the GaAs layer to be very thin, i.e. only a few nm thick, so that no states or no absorbing levels are present in the quantum wells of the As-containing intermediate layer.

This makes it possible to achieve a high transparency of the tunnel diode for the subcells situated under the tunnel diode and simultaneously to provide a tunnel diode having a high peak current density and to increase the efficiency of the multijunction solar cell.

The $n^+$ layer of the first tunnel diode can comprise $In_xAl_{1-x}P$, where $x>0.55$ or where $x>0.6$ or where $x\geq 0.65$. With this sufficiently high indium content, InAlP forms a direct semiconductor. A much higher transparency is achieved compared to conventional InGaAs or InGaP layers.

A reduction of the tunnel current due to the larger band gap of InAlP is counteracted by the intermediate layer according to the invention, preferably a GaAs intermediate layer.

It has also been shown that InAlP having a lower indium content, e.g. x<0.5, is surprisingly not suitable for the n⁺ layer, since it forms an indirect semiconductor.

The intermediate layer can comprise As, an As content of the intermediate layer being higher than an As content of the n⁺ layer. According to alternative refinements, the intermediate layer comprises GaAs or AlGaAs or AlInAs.

The intermediate layer preferably has a thickness less than 6 nm or less than 4 nm and can be doped with silicon having a dopant concentration of at least $10^{18}$ N/cm³.

The intermediate layer can have an energy gap of ≥1.08 eV.

The n⁺ layer of the first tunnel diode can be doped with silicon and/or with tellurium and or with selenium and/or with sulfur having a dopant concentration of ≥$10^{19}$ N/cm³.

The n+ layer of the first tunnel diode can comprise gallium, and according to an example embodiment can comprises AlxGayIn1-x-yP, where 0☐y<0.15 or 0☐y<0.05 or 0☐y<0.01, or the n+ layer of the first tunnel diode can also comprise $Al_{1-x}In_xP$, where x>0.55 or where x>0.6 or where x≥0.65 and comprises gallium.

The p⁺ layer of the first tunnel diode can comprise AlInAs, and according to an example embodiment, it comprises $Al_xGa_yIn_{1-x-y}As$, where x>0.4.

The p⁺ layer of the first tunnel diode can be doped with carbon.

A lattice constant of the n⁺ layer of the first tunnel diode can correspond to the second lattice constant of the second subcell, and a lattice constant of the p⁺ layer of the first tunnel diode can be equal to or less than the second lattice constant of the second subcell.

The multijunction solar cell can comprise additional subcells, each subcell having an additional band gap, the additional subcells being disposed between the first tunnel diode and the first subcell, and the band gaps of the additional subcells each being larger than the first band gap of the first subcell and each being smaller than the second band gap of the second subcell.

The multijunction solar cell can comprise at least one additional tunnel diode. The at least one additional tunnel diode can include an additional intermediate layer, an n⁺ layer of the additional tunnel diode comprising InAlP or InGaP, a p⁺ layer of the additional tunnel diode comprising an As-containing III-V material, the additional intermediate layer being disposed between the n⁺ layer and the p⁺ layer of the additional tunnel diode, and the additional intermediate layer being thinner than the n⁺ layer and the p⁺ layer of the additional tunnel diode in each case.

The bottom tunnel diode of the additional tunnel diodes can have a different composition or is designed without an intermediate layer.

The multijunction cell can be designed as a 4-junction Ge/InGaAs/AlInGaAs/AlInGaP cell, the n⁺ layer of the first tunnel diode (TD1) comprising InAlP. It is understood that, in the 4-junction Ge/InGaAs/AlInGaAs/AlInGaP cell, solar subcell SC2 is formed from AlInGaP, and tunnel diode TD1 is disposed beneath the AlInGaP solar subcell.

The multijunction solar cell can be designed as a 5-junction Ge/InGaAs/AlInGaAs/InGaP/AlInGaP cell, the n⁺ layer of the first tunnel diode (TD1) comprising InAlP. In the 5-junction Ge/InGaAs/AlInGaAs/InGaP/AlInGaP cell, solar subcell SC2 can be formed from AlInGaP, and tunnel diode TD1 can be disposed beneath the AlInGaP solar subcell.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
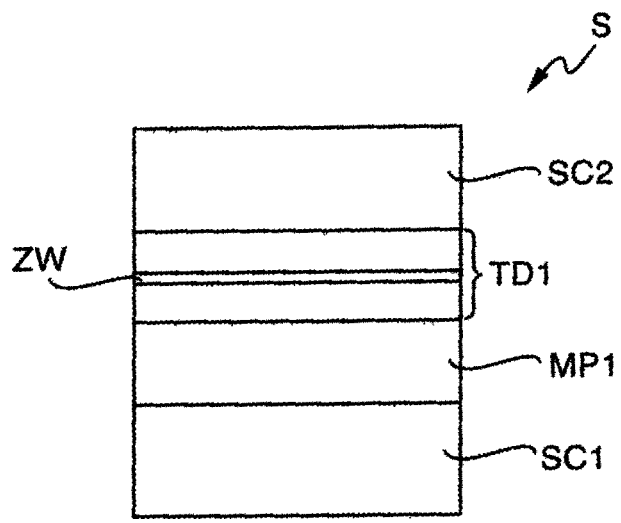
FIG. 1 shows a schematic view of an example embodiment according to the invention of a stacked monolithic upright metamorphic multijunction solar cell.

The illustration in FIG. 1 shows a stacked monolithic upright metamorphic multijunction solar cell S, comprising a first subcell SC1 as the bottom subcell, followed by a metamorphic buffer MP1, a tunnel diode TD1 and a second subcell SC2 as the top subcell.

First subcell SC1 has a first band gap EG1 and a first lattice constant A1 and is made up of germanium by more than 50%.

The second subcell has a second band gap EG2 and a second lattice constant A2, second band gap EG2 being larger than first band gap EG1, and second lattice constant A2 differing from first lattice constant A1.

Metamorphic buffer MP1 balances out the differences between lattice constants A1 and A2 and, for this purpose, includes a sequence of at least three layers having lattice constants which increase from layer to layer in the direction of second subcell SC2.

Tunnel diode TD1 is disposed between metamorphic buffer MP1 and second subcell SC2 and includes an n⁺ layer, a p⁺ layer and an intermediate layer ZW disposed between the n⁺ layer and the p⁺ layer.

The n⁺ layer of first tunnel diode TD1 comprises InAlP, and the p⁺ layer of first tunnel diode TD1 comprises an As-containing III-V material.

Intermediate layer ZW is designed to be thinner than the n⁺ layer and the p⁺ layer in each case.

Figure 2:
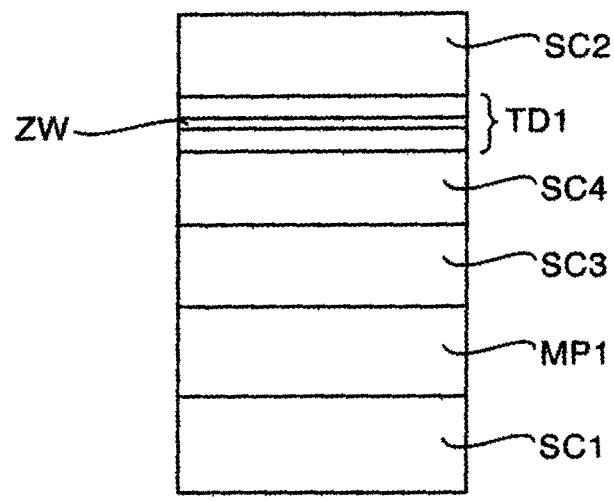
FIG. 2 shows a schematic view of an example embodiment according to the invention of the multijunction solar cell.

Another example is shown in the illustration in FIG. 2. Only the differences from the illustration in FIG. 1 are explained below.

Multijunction solar cell S additionally comprises a third subcell SC3 and a fourth subcell SC4, the two additional subcells SC3 and SC4 each being designed to be lattice-matched to second subcell SC2 and being disposed between metamorphic buffer MP1 and tunnel diode TD1.

Figure 3:
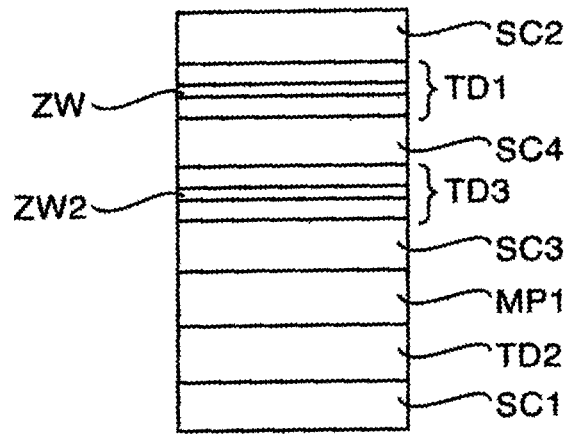
FIG. 3 shows a schematic view of an example embodiment according to the invention of the multijunction solar cell.

Another example is shown in the illustration in FIG. 3. Only the differences from the illustration in FIG. 2 are explained below.

The multijunction solar cell S comprises another tunnel diode TD3, including an intermediate layer according to the invention, in addition to third and fourth subcells SC3 and SC4. The n+ layer of the additional tunnel diode comprises InAlP, the p+ layer of the additional tunnel diode comprising an As-containing III-V material.

While a second tunnel diode TD2 between metamorphic buffer MP1 and first subcell SC1 comprises an n+ layer and a p+ layer but no intermediate layer, third tunnel diode TD3 is built up between third subcell SC3 and fourth subcell SC4 according to first tunnel diode TD1.

Accordingly, third tunnel diode TD3 has another intermediate layer ZW2 between a p+ layer and an n+ layer.

First subcell SC1 is designed as a Ge solar cell or substrate, third subcell SC3 comprises InGaAs, fourth subcell SC4 comprises InAlGaAs and the second subcell comprises InAlGaP. The p+ layer of first tunnel diode TD1 comprises AlInGaAs, the n+ layer comprises InAlP and intermediate layer ZW comprises Ga(Al)As.

Figure 4:
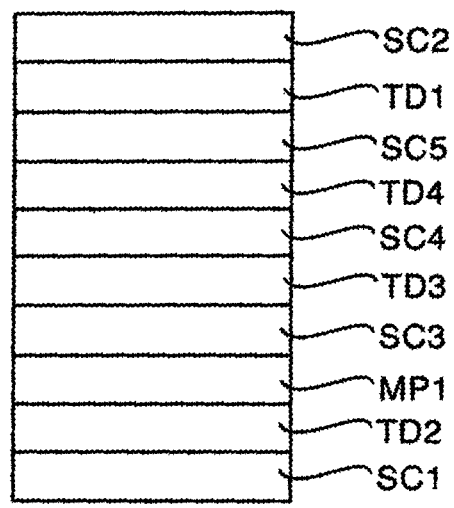
FIG. 4 shows a schematic view of an example embodiment according to the invention of the multijunction solar cell.

Another example is shown in the illustration in FIG. 4. Only the differences from the illustration in FIG. 3 are explained below.

The multijunction solar cell is designed as a 5-junction cell. A second tunnel diode TD2 is disposed on first subcell SC1 designed as a Ge substrate, second tunnel diode TD2 not including an intermediate layer.

Second tunnel diode TD2 is followed by metamorphic buffer MP1, a third subcell SC3 made up of InGaAs, a third tunnel diode TD3, a fourth subcell made up of InAlGaAs, a fourth tunnel diode TD4, a fifth subcell made up of InGaP, first tunnel diode TD1 and the second subcell made up of InAlGaP.

The first tunnel diode includes an AlInGaAs layer as the p+ layer, an InAlP layer as the n+ layer and an intermediate layer ZW made up of Ga(Al)As between the n+ layer and the p+ layer.

Second tunnel diode TD2 does not have an intermediate layer.

Like second tunnel diode TD2, third and fourth tunnel diodes TD3 and TD4 do not have an intermediate layer in the illustrated exemplary embodiment. In the illustrated exemplary embodiment, the n+ layer of the third and fourth tunnel diodes comprises InGaP or InAlP.

Alternatively, the fourth tunnel diode also comprises an intermediate layer. Alternatively, in addition to fourth tunnel diode TD4, third tunnel diode TD3, in turn, also comprises an intermediate layer.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A stacked monolithic upright metamorphic multijunction solar cell comprising:
  at least one first subcell having a first band gap, a first lattice constant, and is made of germanium by more than 50%;
  a second subcell, which is disposed above the first subcell, has a second band gap and a second lattice constant, and is made of AlInGaP;
  a metamorphic buffer disposed between the first subcell and the second subcell; and
  a first tunnel diode that includes an n+ layer and a p+ layer, the first tunnel diode being arranged between the metamorphic buffer and the second subcell, the p+ layer of the first tunnel diode comprising an As-containing III-V material,
  wherein the second band gap is larger than the first band gap,
  wherein the second lattice constant is larger than the first lattice constant,
  wherein the n+ layer of the first tunnel diode comprises $In_xAl_{1-x}P$, where x>0.6,
  wherein an intermediate layer is disposed between the n+ layer and the p+ layer,
  wherein the intermediate layer is thinner than the n+ layer and the p+ layer,
  wherein the intermediate layer has a thickness of less than 6 nm or less than 4 nm,
  wherein the intermediate layer comprises GaAs or AlGaAs or AlInAs or InGaAs or AlInGaAs,
  wherein the intermediate layer is doped with silicon having a dopant concentration of at least $10^{18}$ N/cm$^3$,
  wherein an As content of the intermediate layer is higher than an As content of the n+ layer, and
  wherein the intermediate layer suppresses cross contamination of dopants between the n+ layer and the p+ layer of the tunnel diode.

2. The multijunction solar cell according to claim 1, wherein the intermediate layer has an energy gap of ≥1.08 eV.

3. The multijunction solar cell according to claim 1, wherein the n+ layer of the first tunnel diode is doped with silicon and/or with tellurium and/or with selenium and/or with sulfur having a dopant concentration of ≥$10^{19}$ N/cm$^3$.

4. The multijunction solar cell according to claim 1, wherein the p+ layer of the first tunnel diode comprises AlInAs.

5. The multijunction solar cell according to claim 1, wherein the p+ layer of the first tunnel diode comprises $Al_xGa_yIn_{1-x-y}As$, where x>0.4.

6. The multijunction solar cell according to claim 1, wherein the p+ layer of the first tunnel diode is doped with carbon.

7. The multijunction solar cell according to claim 1, wherein a lattice constant of the n+ layer of the first tunnel diode corresponds to the second lattice constant of the second subcell, and
  wherein a lattice constant of the p+ layer of the first tunnel diode is equal to or less than the second lattice constant of the second subcell.

8. The multijunction solar cell according to claim 1, wherein the multijunction solar cell comprises additional subcells, each having a band gap, the additional subcells being disposed between the first tunnel diode and the first subcell, and the band gaps of the additional subcells each being larger than the first band gap of the first subcell and each being smaller than the second band gap of the second subcell.

9. The multijunction solar cell according to claim 8, wherein the multijunction solar cell comprises at least one additional tunnel diode.

10. The multijunction solar cell according to claim 9, wherein the at least one additional tunnel diode comprises an additional intermediate layer, an n+ layer of the additional tunnel diode comprising InAlP or InGaP, a p+ layer of the additional tunnel diode comprising an As-containing III-V material, the additional intermediate layer being disposed between the n+ layer and the p+ layer of the additional tunnel diode, and the additional intermediate layer being thinner than the n+ layer and the p+ layer of the additional tunnel diode.

11. The multijunction solar cell according to claim 1, wherein the multijunction solar cell is a 4-junction Ge/InGaAs/AlInGaAs/AlInGaP cell.

12. The multijunction solar cell according to claim 1, wherein the multijunction solar cell is a 5-junction Ge/InGaAs/AlInGaAs/InGaP/AlInGaP cell.

13. The multijunction solar cell according to claim 1, wherein the intermediate layer operates to counteract a reduction in a tunnel current of the first tunnel diode due to the n+ layer.

14. A stacked monolithic upright metamorphic multijunction solar cell comprising:
- at least one first subcell having a first band gap, a first lattice constant and is made of germanium by more than 50%;
- a second subcell, which is disposed above the first subcell, has a second band gap and a second lattice constant, and is made of AlInGaP;
- a metamorphic buffer disposed between the first subcell and the second subcell; and
- a first tunnel diode that includes an n+ layer and a p+ layer, the first tunnel diode being arranged between the metamorphic buffer and the second subcell, the p$^+$ layer of the first tunnel diode comprising an As-containing III-V material, wherein the second band gap is larger than the first band gap, wherein the second lattice constant is larger than first lattice constant, wherein the n$^+$ layer of the first tunnel diode comprises $In_xAl_{1-x}P$, where x>0.6, wherein an intermediate layer is disposed between the n$^+$ layer and the p$^+$ layer, wherein the intermediate layer is thinner than the n$^+$ layer and the p$^+$ layer, wherein the intermediate layer has a thickness of less than 6 nm or less than 4 nm, wherein the intermediate layer comprises GaAs or AlGaAs or AlInAs or InGaAs or AlInGaAs such that the intermediate layer counteracts a reduction in a tunnel current of the first tunnel diode due to the n+ layer, and wherein the intermediate layer suppresses cross contamination of dopants between the n$^+$ layer and the p$^+$ layer of the tunnel diode.

15. The multijunction solar cell according to claim 1, wherein the second subcell is a topmost subcell.

16. The multijunction solar cell according to claim 14, wherein the second subcell is a topmost subcell.

17. The multijunction solar cell according to claim 1, wherein the second subcell is made entirely of AlInGaP.

18. The multijunction solar cell according to claim 1, wherein the intermediate layer has a one-part design and is made by metalorganic vapor phase epitaxy.

19. The multijunction solar cell according to claim 1, wherein the metamorphic buffer layer comprises a sequence of three layers, each of the three layers having a lattice constant, and
- wherein the lattice constant of the three layers increases layers to layer in a direction of the second subcell.

\* \* \* \* \*